(12) United States Patent
Cleveland

(10) Patent No.: US 6,236,603 B1
(45) Date of Patent: May 22, 2001

(54) HIGH SPEED CHARGING OF CORE CELL DRAIN LINES IN A MEMORY DEVICE

(75) Inventor: Lee Edward Cleveland, Santa Clara, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/489,232

(22) Filed: Jan. 21, 2000

(51) Int. Cl.[7] .................................................. G11C 7/00
(52) U.S. Cl. .......................... 365/203; 365/204; 365/205
(58) Field of Search .................................. 365/203, 207, 365/204, 205, 196, 190

(56) References Cited

U.S. PATENT DOCUMENTS 5,313,434 * 5/1994 Abe ..................................... 365/233.5
5,828,610 * 10/1998 Roger et al. ........................... 365/203
6,072,738 * 6/2000 Brown ................................... 365/203

* cited by examiner

Primary Examiner—David Nelms
Assistant Examiner—David Lam
(74) Attorney, Agent, or Firm—Brinks Hofer Gilson & Lione

(57) ABSTRACT

A memory integrated circuit (100) includes an array (102) of core cells (202) addressable by a plurality of word lines (120) and a plurality of drain lines (122). Address circuitry selects one or more word lines and one or more drain lines. Sensing circuit (110) senses a data state of one or more selected core cells of the array of core sells. Drain line charging circuitry charges one or more drain lines prior to sensing this data state. The drain line charging circuitry includes a rapid charging circuit (230) for precharging the one or more drain lines to the predetermined voltage during a precharge period, and a final charging circuit (214) for charging the one or more drain lines to a final charge voltage for sensing the data state.

12 Claims, 2 Drawing Sheets

HIGH SPEED CHARGING OF CORE CELL DRAIN LINES IN A MEMORY DEVICE

BACKGROUND OF THE INVENTION

The present invention relates generally to memory integrated circuits. More particularly, the present invention relates to method and apparatus for high speed charging of core cell drain lines in a memory integrated circuit.

Conventional memory integrated circuits include an array of core cells. Each core cell stores one or more bits of information. Each core cell is independently addressable for writing and reading data. Each core cell includes one or more transistors suitable for retaining data. Each core cell is located at the intersection of a row or word line and a column or bit line, with a drain of one transistor coupled to a bit line. By applying appropriate voltages to the word line and the bit line, the data may be written in the core cell. By applying an appropriate word line voltage and selecting an appropriate bit line using decoding transistors, the current in the core cell may be detected to read the state of the data stored in the core cell. Common memory device types include flash, EPROM, EEPROM and others.

In reading the data in core cells, a large amount of time has been required to charge the capacitance associated with the drain of the core cell. This large drain capacitance is due to the large number of transistors coupled to the column line; capacitance due to routing the column line over other devices and the substrate; and the capacitance of the decoding transistors. Charging the drain line or bit line is a necessary part of sensing the state of the stored data in the selected core cell.

Sensing occurs by detecting a voltage change on the drain line. In one example, the drain line is charged to 0.5 volts. The desired core cell is selected by asserting its word line to a read voltage. This causes the core cell transistor to conduct a relatively low current (if it has been programmed) or a relatively high current (if it is un-programmed). The low current will cause a deflection in the bit line voltage to, for example, 0.55 volts. The high current will cause a bit line voltage deflection to 0.45 volts, for example. The sensing circuit must be able to reliably sense the voltage deflection of 0.05 volts. To minimize the time required to sense the state of the core cell, which is a key design goal for a memory device, the time required to charge the drain line to should be minimized.

In previous designs, the drain line or bit line has been charged using a circuit of ratioed transistors. These transistors are part of the sensing circuit. By selecting the relative sizes of the transistors as well as other physical properties, the precharge voltage (0.5 volts in the example above) can be set. The transistors are coupled to a selected bit line and given time to charge up the associated capacitance.

However, this previous charging circuit has required a design trade off. If the transistors are sized relatively small, a large voltage deflection (i.e., greater than the 0.05 volt deflection in the example above) is created. This improves the sense margin for the memory device, thereby improving its rejection of noise and its reliability. However, the small sized transistors are relatively weak and can not conduct enough current to rapidly charge the drain line. On the other hand, if the sizes of the transistors are increased to increase their current drive and shorten the charging time for the drain line, the voltage deflection during sensing is reduced (i.e., to less than the 0.05 volt deflection in the example above).

Accordingly, there is a need for a method and apparatus which provides a large voltage deflection on the drain line to maintain an adequate sense margin but which also provides high speed charging of the core cell drain lines.

DETAILED DESCRIPTION OF THE PRESENTLY PREFERRED EMBODIMENTS

Figure 1:
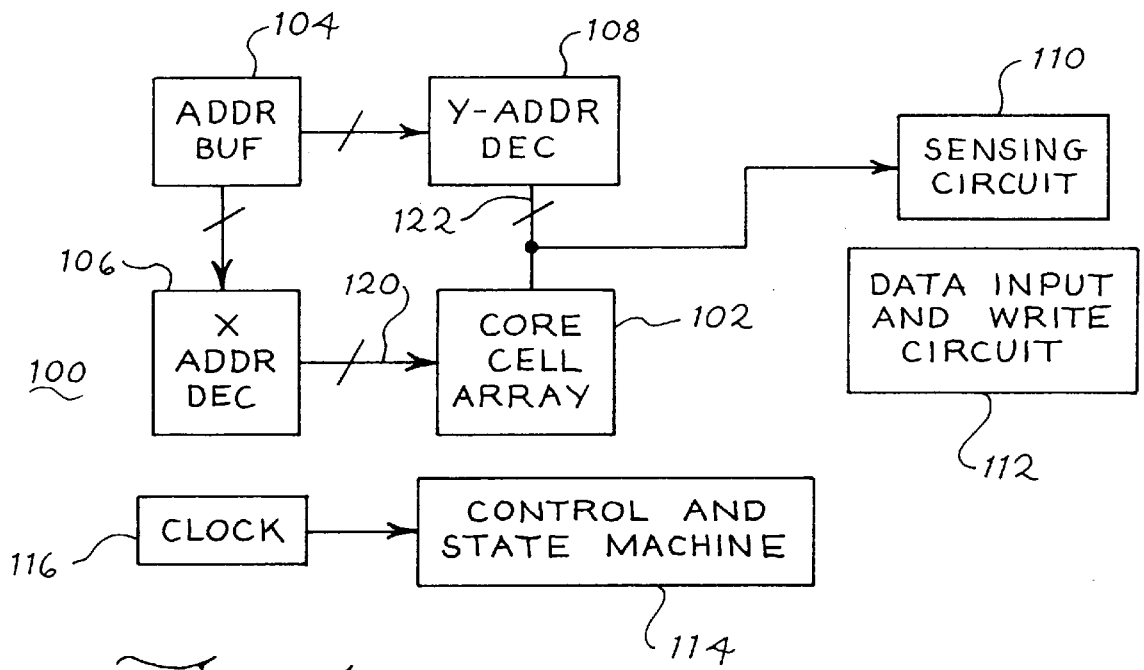
FIG. 1 is a block diagram of a memory device.

Referring now to FIG. 1, it shows a block diagram of a memory integrated circuit 100. The memory integrated circuit or memory device 100 includes a core cell array 102, address buffers 104, X address decoder 106, Y address decoder 108, a sensing circuit 110, a data input and write circuit 112, a controller and state machine 114 and a clock 116.

The core cell array 102 contains a plurality of core cells suitable for storing one or more bits of data in each core cell. The core cell array may be any suitable size such as 16 MBits, 32 MBits or otherwise. The array of core cells is addressable by a plurality of word lines 120 and a plurality of bit lines or drain lines 122. By applying a suitable voltage to one or more word lines, a row of core cells in the core cell array 102 is selected. When a core cell is selected, it conducts a current, the value of the current depending on the data state of the bits stored in the core cell. In a first data state the current conducted will be relatively small. In a second data state, the current conducted will be relatively large. This current is conducted in one or more of the drain lines 122. The current is sensed by the sensing circuit 110.

The address buffers 104, the X address decoder 106 and the Y address decoder 108 together form address circuitry for selecting one or more word lines and one or more drain lines. An address is received by the address buffers 104 from external to the memory integrated circuit 100. The address is a multibit value that defines one or more unique locations in the core cell array for reading or storage of data. The address buffer generates internal addresses which are provided to the X address decoder 106 and the Y address decoder 108. In response to these internal addresses, the X address decoder selects one or more word line 120 for activating a row of the core cell array. In similar manner, the Y address decoder selects one or more bit lines or drain lines 121 for reading the data stored in the selected core cells. If the core cell array is arranged as a plurality of sectors or subsectors, there may be an additional level of sector decoding and more than one word line in different sectors may be selected. Similarly if the core cell array is arranged with a plurality of sectors, more than one drain line 122 may be selected. Still further if the output from the memory integrated circuit 100 is byte wide (8 bits), word wide (16 bits) or other size, more than one drain lines 122 may be selected by the Y address decoder 108.

The data input in write circuit 112 receives data from external to the memory integrated circuit 100 for writing and storage in the core cell array. If the memory 100 is a flash memory, the data input and write circuit 112 may include voltage generators for generating on-chip voltages suitable for erasing and programming selected core cells in the core cell array 102. Any suitable design for the data input and write circuit 112 may be used.

The controller and state machine 114 controls the operation of the memory device 100. The controller and state machine 114 receives clocking signals from the clock circuit 116 to control the timing of internal operations, such as programming, reading and writing of data, in the memory device 100.

It is to be understood that the memory device 100 may include other circuits necessary for operation. In addition, circuit blocks and inter-connections have been simplified so as not to unduly complicate the drawing figure. In addition, the memory device 100 may be embedded memory circuit contained within another integrated circuit or electronic device. Embodiment as a stand-alone integrated circuit is just one application for the method and apparatus described herein.

Figure 2:
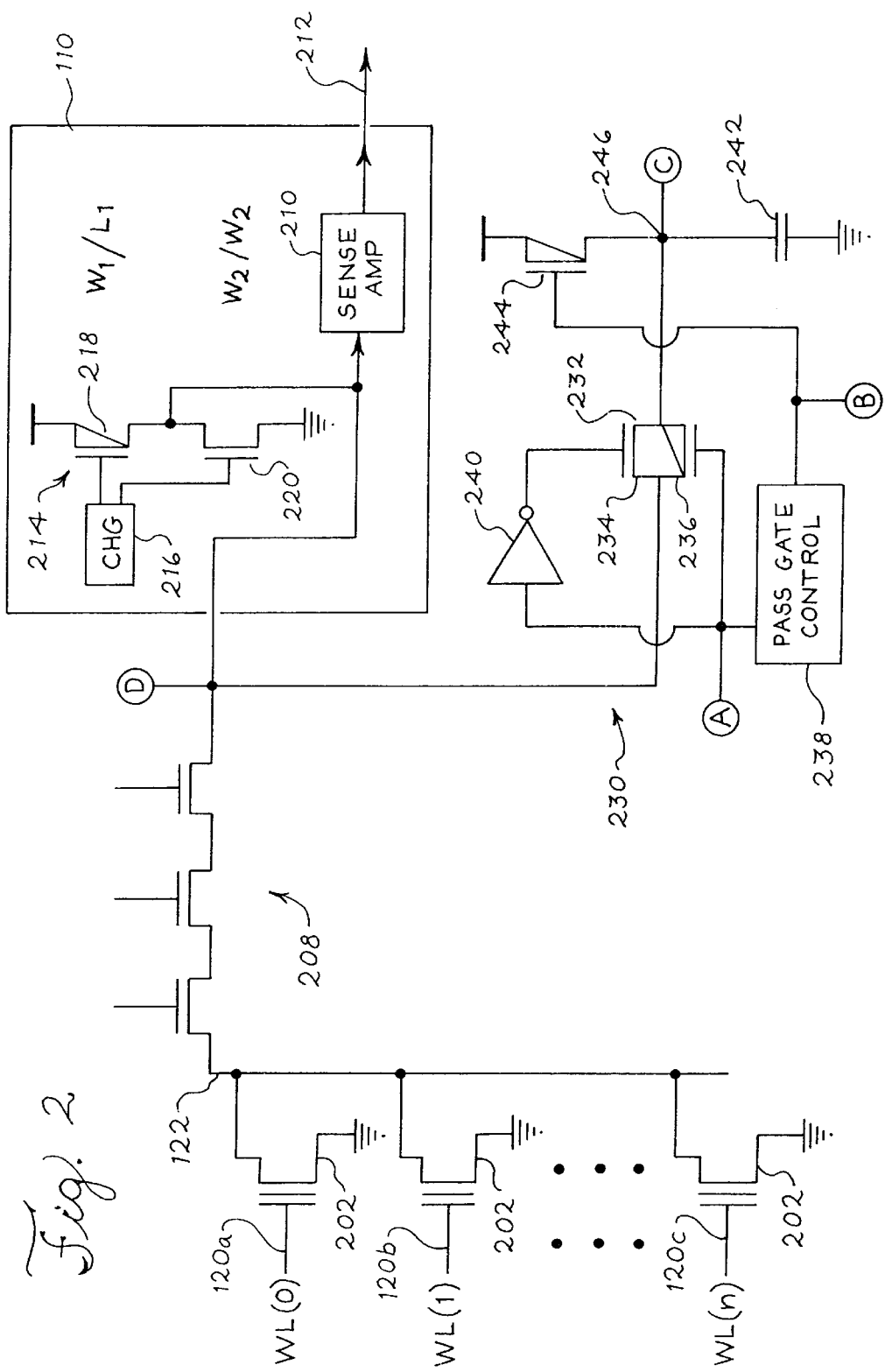
FIG. 2 is a diagram of a portion of the memory device of FIG. 1.

FIG. 2 is a diagram of a portion of the memory integrated circuit 100 of FIG. 1. FIG. 2 shows a plurality of core cells 202 disposed along a drain line 122 of the core cell array 102 of FIG. 1. Each core cell 202 is a flash memory cell having a floating gate upon which charge may be stored by programming for subsequent reading of data. When a first amount of charge is stored on the floating gate, the first data state is stored in the core cell 202. When a second amount of charge is stored on the floating gate, a second data state is stored in the core cell 202. Depending on the amount of charge stored, when the core cell 202 is selected by activating a word line 120a, 120b, 120c a read current is conducted in the selected core cell 202. The value of the read current is related to the amount of charge stored on the floating gate.

The read current is conducted in the drain line 122 through Y-address decoding transistors 208. The signals which control the Y-address decoding transistors 208 are generated by the Y-address decoder 108 of FIG. 1. If the drain line 122 has been selected, the gates of each of the Y-address decode transistors 208 will be driven to a high voltage level, turning on these transistors. The read current is conducted through the Y-decode transistors 208 to the sensing circuit 110. Sensing circuit 110 includes a sense amplifier 210 which detects the value of the current and produces a voltage deflection related to the magnitude of the current. Based on this voltage deflection, a decision is made about the data state stored in the selected core cell 202 and a binary output is provided at an output 212.

The drain line 122 is a highly capacitive node. The drain line 122 sees capacitance at the drains of each of the memory cells 202. Further, the drain line 122 sees capacitance at each of the Y-address decoding transistors 208. Still further, the drain line 122 may extend over other circuitry in the core cell array and adjacent to the core cell array, adding additional capacitance to the drain line. Because of this large capacitance, the drain line 122 can be slow to charge and discharge. Rapid charging and discharging requires substantial current drive. However, in order to sense adequately the current in the drain line by the sense amplifier 210, the drain line voltage 122 must be raised to a predetermined voltage, such as 0.5 volts.

The sensing circuit 110 includes a charging circuit 214 suitable for charging the drain line to its final value. The charging circuit includes a charge controller 216, a first transistor 218 and a second transistor 220. The transistor 218, 220 are ratioed to produce on the drain line 122 a final charging voltage for sensing the data state. That is, the first transistor 218 has an aspect ratio equal to $W_1L_1$, defining the width to length ratio of the gate of the transistor 218. Similarly, the second transistor 220 has an aspect ratio $W_2/L_2$ defining the gate width and gate length for the second transistor 220. The aspect ratios of the transistors 218 and 220 may be chosen to drive the voltage on the drain line 122 to a predetermined value, such as 0.5 volts. The voltage on the gate of the first transistor 218 and the second transistor 220 is controlled by the charge control circuit 216 in a manner known in the art.

The current drive available from a transistor such as the transistors 218, 220 is limited and is controlled by the aspect ratios of the two transistors. Unfortunately, the need to provide substantial current drive to rapidly charge the drain line 122 is in conflict with a need to maintain a substantial sense margin between the voltage on the drain line when the selected core cell stores a logic 1 value and the voltage on the drain line on the selected core cell stores a logic zero value.

In order to eliminate this design trade-off, a charging circuit 230 is added to the drain line. The charging circuit 230 is configured to charge at least one drain line 122 to a precharge voltage during a precharging time period. The charging circuit includes a pass gate 232 including a first transistor 234 and a second transistor 236. The charging circuit 230 further includes a pass gate control circuit 238 and an inverter 240. The charging circuit 230 further includes reservoir capacitor 242 and a transistor 244.

The pass gate 232 is a conventional complementary metal oxide semiconductor (CMOS) pass gate. The transistor 234 is an n-channel transistor and the transistor 236 is a p-channel transistor. The pass gate control circuit 238 generates a signal on a node labeled A in FIG. 2 which turns on and turns off the transistors 234, 236 of the pass gate 232. The inverter 240 inverts the signal on the node A to provide a complementary signal to the gate of the n-channel transistor 234. The pass gate 232 is coupled between one or more drain lines such as drain line 122, labeled D in FIG. 2, and a charging node 246, labeled C in FIG. 2. The pass gate control circuit 232 may be any suitable circuit, for example, a block of digital logic responsive to the controller and state machine 114 (FIG. 1) for controlling the pass gate 232.

The reservoir capacitor 242 is coupled between the charging node 246 and ground potential. The reservoir capacitor 242 forms a charge storage means for storing charge. In one embodiment, the reservoir capacitor 242 is a metal oxide semiconductor capacitor but other charge storage means may be used. The transistor 244 is coupled between the charging node 246 and positive supply potential. The gate of the transistor 244 is controlled by a signal generated by the pass gate control circuit 238 and provided on a node labeled B in FIG. 2.

The pass gate 232 forms a switch means coupled to the charge storage means for selectively coupling the charge storage means to the one or more drain lines during a precharge period. Other types of switch means such as individual transistors or combination of transistors forming logic gates or timing circuitry may be used in place of the pass gate to provide the function of the switch means. In the illustrated embodiment, the switch means further includes the transistor 244 coupled between the charge storage means and the reference potential or positive supply voltage for selectively coupling the charge storage means to the reference potential before the precharge period. Again, other types of switches such as transistors and logic gates may be substituted in place of the transistors 244.

Figure 3:
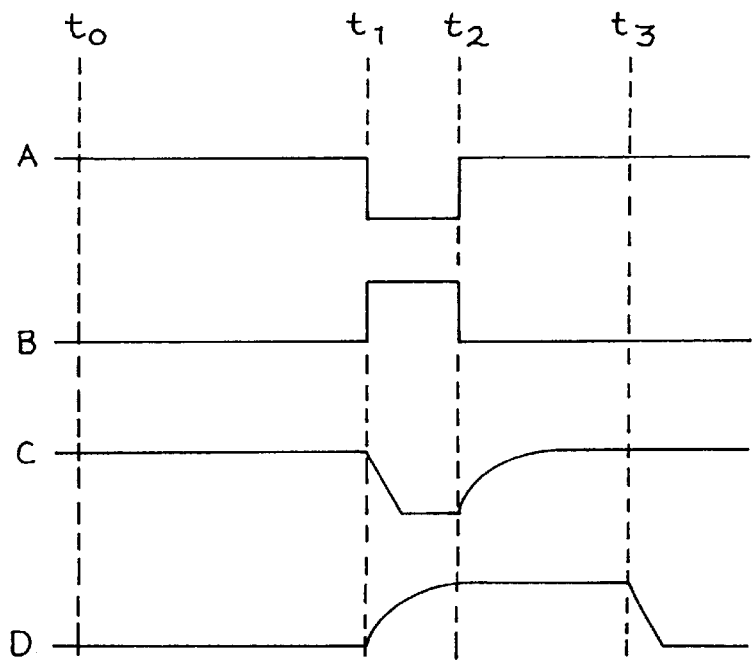
FIG. 3 is a timing diagram illustrating operation of the memory device portion of FIG. 2.

Operation of the charging circuit 230 will be described in conjunction with the timing diagram of FIG. 3. In FIG. 3, the signals are labeled according to the node labels of FIG. 2. Initially, during a charging time period from time $t_0$ to time $t_1$, the pass gate control circuit 238 drives the voltage on the node labeled A to a high value and the voltage on the node labeled B to a low value. This turns off the pass gate 232 and turns on the transistor 244. With the pass gate 232 turned off, the charging node 246, labeled C, is charged through the transistor to the positive supply voltage. It is to be understood that any suitable reference voltage may be used. In the embodiment of FIG. 2, the positive supply voltage is used for convenience. However, any reference voltage may be generated on chip or provided from off chip as a suitable precharge voltage. This precharge level is indicated in FIG. 3 for the charging node labeled C. Thus, during a charging time period, from time $t_0$ until time $t_1$, in FIG. 3, the charge node 246 is charged to a predetermined voltage.

At time $t_1$, the voltage on the node labeled A in FIG. 2 and FIG. 3 is driven to a low potential and the voltage on the node labeled B is driven to a high potential by the pass gate control circuit 238. Driving the node labeled A to a low potential turns on the p-channel transistor 236. The low potential on node A is inverted by the inverter 240, turning on the n-channel transistor 234. This opens the pass gate 232, coupling the charging node 246 to the drain line 122. At substantially the same time, the node labeled B is driven high, turning off the p-channel transistor 244. This isolates the charging node 246 from the reference voltage or positive supply potential.

The effect of coupling the drain line 122 and the charging node 246 can be seen in FIG. 3. The charging node, labeled C is pulled to a logic low value but the drain line 122 is rapidly pulled to a level near the desired sensing level required by the sense amplifier 210. By charge sharing between the reservoir capacitor 242 and the drain line 122 through the pass gate 232, the drain line 122 can be rapidly charged to a precharge voltage. Preferably the reservoir capacitor 242 is sized to store sufficient charge to rapidly charge the drain line 122 to within a few percent of the final value required by the sense amplifier 210. The precharge voltage may be selected to be any suitable value, such as a value within a few percent of the final valued required for sensing data on the drain line 122.

At time $t_2$ in FIG. 3, the signal on node A is driven high and the signal on node B is driven low. This shuts off the pass gate 232 and again couples the charging node 246 to the reference potential or positive supply voltage. As seen in FIG. 3, during the subsequent time period after time $t_2$, the voltage on the charging node 246 is re-charged through the transistor 244 back to the reference potential.

Meanwhile, during this subsequent time period the charging circuit 214 in the sensing circuit 110 charges the drain line 122 to its final value. The final value is the value required by the sense amplifier 210 for reliably sensing the data state in the selected core cell 202. After the charging circuit 230 drives the drain line to the precharge value, the charging circuit 214 charges the drain line voltage to the final value. Thus, the transistors 218, 220 of the charging circuit 214 do not need to provide a large charging current to charge the drain line. The transistors 218, 220 can be smaller in size and therefore more resistive (less conductive). Such transistors can provide a larger voltage deflection on the drain line 122. A larger sense margin can be designed for the sense amplifier 210, improving the sensing performance of the sensing circuit 110.

Thus, the trade-off between high current drive and high sense margin required in the design of the conventional drain line driving circuit 214 is reduced or eliminated. The charging circuit 230 operates as a rapid charging means coupled to one or more drain lines 122 for precharging the one or more drain lines 122 to a predetermined voltage during the precharge period. The charging circuit 214 of the sensing circuit 110 operates as a final charging means for charging the one or more drain lines 122 to a final charge voltage for sensing the data state of the selected core cell 202. In combination, the charging circuit 230 and the charging circuit 214 form drain line charging circuitry for charging one or more drain lines prior to sensing the data state.

From the foregoing, it can be seen that the present invention provides an improved method and apparatus providing a large voltage deflection on the drain line and maintaining an adequate sense margin but which also provide high speed charging of core cell drain lines. The previously required trade-off between current drive and sense margin in the drain line charging function of the sensing circuit has been eliminated or reduced. Instead of charging the drain line through one or more transistors which set the sense margin, a capacitor is charged during timed periods when sensing does not occur. Through charge sharing, the voltage on the one or more selected drain lines is rapidly driven to a predetermined voltage during a precharge period.

While a particular embodiment of the present invention has been shown and described, modifications may be made. It is therefore intended in the appended claims to cover all such changes and modifications which follow in the true spirit and scope of the invention.

What is claimed is:

1. A method for operating a memory circuit including a core cell array and a sensing circuit, the method comprising:
   (a) during a charging time period, charging a charge node to a predetermined voltage by opening a switch between the charge node and a reference voltage and charging a reservoir capacitor coupled to the charge node to the predetermined voltage;
   (b) during a precharging time period, closing the switch to isolate the charge node from the reference voltage and opening a second switch, coupling the charge node to a drain line of the core cell array to charge the drain line to a precharge voltage;
   (c) during a subsequent time period,
     (c1) closing the switch to charge the reservoir capacitor at the charge node to the predetermined voltage, and
     (c2) charging the drain line to a final sensing value.

2. A memory circuit comprising:
   a core cell array including a plurality of drain lines;
   a charging circuit including a capacitor and switch and configured to charge at least one drain line to a precharge voltage during a precharging time period by closing the switch; and
   a final charge circuit coupled to the at least one drain line and configured to charge the drain line to a final charge value.

3. The memory circuit of claim 2 further comprising:
   a sensing circuit selectively coupled to the at least one drain line and configured to sense a signal on the at least one drain line during a sensing time period after the at least one drain line has been charged to the final charge value.

4. A memory circuit comprising:
   a core cell array including a plurality of drain lines;
   a charging circuit configured to charge at least one drain line to a precharge voltage during a precharging time period, including a reservoir capacitor coupled to a charge node;

a first switch actuable to selectively charge the reservoir capacitor; and a second switch actuable to selectively couple the charge node to the at least one drain line; and a final charge circuit coupled to the at least one drain line and configured to charge the drain line to a final charge value.

5. The memory circuit of claim 4 further comprising:

a gate control circuit coupled to the first switch and the second switch to control the first switch and the second switch.

6. The memory circuit of claim 5 wherein the second switch comprises a pass gate coupled between the charge node and the at least one drain line.

7. A memory integrated circuit comprising:

an array of core cells addressable by a plurality of word lines and a plurality of drain lines;

address circuitry for selecting one or more word lines and one or more drain lines;

sensing circuitry for sensing a data state of one or more selected core cells of the array of core cells;

drain line charging circuitry for charging one or more drain lines prior to sensing the data state, including rapid charging means for precharging the one or more drain lines to a predetermined voltage during a precharge period by closing a switch selectively coupling a capacitor to the one or more drain lines, and final charging means for charging the one or more drain lines to a final charge voltage for sensing the data state.

8. The memory integrated circuit of claim 7 wherein the final charging means comprises:

two or more ratioed transistors sized to charge the one or more drain lines to the final charge voltage.

9. A memory integrated circuit comprising:

an array of core cells addressable by a plurality of word lines and a plurality of drain lines;

address circuitry for selecting one or more word lines and one or more drain lines;

sensing circuitry for sensing a data state of one or more selected core cells of the array of core cells;

drain line charging circuitry for charging one or more drain lines prior to sensing the data state, including rapid charging means coupled to the one or more drain lines for precharging the one or more drain lines to a predetermined voltage during a precharge period, the rapid charging means including charge storage means for storing charge; and switch means coupled to the charge storage means for selectively coupling the charge storage means to the one or more drain lines during the precharge period; and final charging means for charging the one or more drain lines to a final charge voltage for sensing the data state.

10. The memory integrated circuit of claim 9 wherein the switch means comprises:

one or more transistors coupled between the charge storage means and the one or more drain lines.

11. The memory integrated circuit of claim 10 wherein the switch means further comprises: one or more transistors coupled between the charge storage means and a reference potential for selectively coupling the charge storage means to the reference potential before the precharge period.

12. The memory integrated circuit of claim 9 wherein the sensing circuitry senses the data state after the precharge period.

* * * * *